United States Patent
Ikeda et al.

(10) Patent No.: US 7,684,513 B2
(45) Date of Patent: Mar. 23, 2010

(54) AMPLIFIER CIRCUIT AND AMPLIFYING METHOD

(75) Inventors: Kazuhiko Ikeda, Hakusan (JP); Takashi Izumi, Kanazawa (JP); Takashi Enoki, Yokohama (JP)

(73) Assignee: Panasonic Corporation, Osaka (JP)

( * ) Notice: Subject to any disclaimer, the term of this patent is extended or adjusted under 35 U.S.C. 154(b) by 967 days.

(21) Appl. No.: 10/572,577

(22) PCT Filed: Sep. 17, 2004

(86) PCT No.: PCT/JP2004/013683

§ 371 (c)(1),
(2), (4) Date: Mar. 17, 2006

(87) PCT Pub. No.: WO2005/031993

PCT Pub. Date: Apr. 7, 2005

(65) Prior Publication Data

US 2007/0076814 A1    Apr. 5, 2007

(30) Foreign Application Priority Data

Sep. 25, 2003  (JP) .............................. 2003-333490

(51) Int. Cl.
H04L 25/49    (2006.01)
H03F 3/66     (2006.01)
(52) U.S. Cl. ......................................... 375/297; 330/52
(58) Field of Classification Search ................. 375/295, 375/296, 297, 132, 302, 344, 345; 330/52, 330/124, 124 R, 143, 151, 152, 10, 27; 455/73, 455/194.2, 311, 341; 370/522, 525, 526, 370/527, 528
See application file for complete search history.

(56) References Cited

U.S. PATENT DOCUMENTS

| | | | | |
|---|---|---|---|---|
| 4,401,853 A | * | 8/1983 | Fisher et al. | ................... 381/15 |
| 5,287,069 A | | 2/1994 | Okubo et al. | |
| 5,691,668 A | * | 11/1997 | Yoshikawa et al. | .......... 330/151 |
| 6,054,894 A | | 4/2000 | Wright | |
| 6,081,156 A | * | 6/2000 | Choi et al. | .................... 330/52 |

(Continued)

FOREIGN PATENT DOCUMENTS

JP          622302       11/1989

(Continued)

OTHER PUBLICATIONS

Japanese Office Action dated Oct. 17, 2006 with English translation.

(Continued)

*Primary Examiner*—Tesfaldet Bocure
*Assistant Examiner*—Lawrence B Williams
(74) *Attorney, Agent, or Firm*—Dickinson Wright PLLC

(57) ABSTRACT

An amplifying method and apparatus generates a plurality of constant envelope signals from an input signal and generates a plurality of pilot signals associated with the generated plurality of constant envelope signals, respectively. The plurality of pilot signals have predetermined amplitudes, predetermined phases, and predetermined frequencies, respectively, and the phases and frequencies are different from each other. The plurality of pilot signals are added to the generated plurality of constant envelope signals, and the sum is amplified. An amplitude or phase of one of the generated plurality of constant envelope signals is corrected using signal components included in the amplified plurality of constant envelope signals.

10 Claims, 11 Drawing Sheets

U.S. PATENT DOCUMENTS

| | | | |
|---|---|---|---|
| 6,320,464 B1 * | 11/2001 | Suzuki et al. | 330/151 |
| 6,392,483 B2 * | 5/2002 | Suzuki et al. | 330/151 |
| 6,496,062 B1 * | 12/2002 | Nitz et al. | 330/52 |
| 6,515,544 B1 * | 2/2003 | Suzuki et al. | 330/151 |
| 6,587,513 B1 | 7/2003 | Ichihara | |
| 6,674,324 B1 | 1/2004 | Ocenasek et al. | |
| 6,750,706 B2 * | 6/2004 | Ishida et al. | 330/52 |
| 6,774,716 B2 * | 8/2004 | Suto | 330/52 |
| 7,035,312 B2 * | 4/2006 | Myer | 375/132 |
| 2002/0084845 A1 * | 7/2002 | Eisenberg et al. | 330/52 |
| 2002/0105379 A1 * | 8/2002 | Nakayama et al. | 330/151 |
| 2003/0085759 A1 | 5/2003 | Suzuki et al. | |
| 2004/0017253 A1 * | 1/2004 | Ishigami et al. | 330/52 |
| 2007/0030063 A1 * | 2/2007 | Izumi et al. | 330/124 R |
| 2007/0090874 A1 * | 4/2007 | Sorrells et al. | 330/10 |
| 2007/0247220 A1 * | 10/2007 | Sorrells et al. | 330/10 |
| 2007/0247221 A1 * | 10/2007 | Sorrells et al. | 330/10 |
| 2007/0247222 A1 * | 10/2007 | Sorrells et al. | 330/10 |
| 2008/0039024 A1 * | 2/2008 | Ikeda et al. | 455/73 |

FOREIGN PATENT DOCUMENTS

| | | |
|---|---|---|
| JP | 2758682 | 10/1991 |
| JP | 537263 | 2/1993 |
| JP | 200069098 | 3/2000 |
| JP | 2001148661 | 5/2001 |
| JP | 2002158546 | 5/2002 |
| JP | 200369349 | 3/2003 |
| JP | 2003209445 | 7/2003 |

OTHER PUBLICATIONS

L. Sundstrom: "Automatic adjustment of gain and phase imbalances in LINC transmitters", Electronic Letters, vol. 31, No. 3, Feb. 2, 1995, pp. 155-156.

PCT International Search Report dated Jan. 11, 2005.

European Search Report Dated Apr. 14, 2008.

* cited by examiner

AMPLIFIER CIRCUIT AND AMPLIFYING METHOD

TECHNICAL FIELD

The present invention relates to an amplifier circuit and amplifying method, and particularly relates to an amplifier circuit and amplifying method amplifying a transmission signal at transmission apparatus employed in wireless communication and broadcasting.

BACKGROUND ART

In recent years, it becomes more often that digitally modulated signals are transmitted at transmission apparatuses employed in wireless communication and broadcasting. These signals are now able to carry information in an amplitude direction due to introduction of M-ary techniques, and linearity is therefore required in an amplifier circuit employed in a transmission apparatus. On the other hand, high power efficiency is required to an amplifier circuit in order to curtail the power consumption of an apparatus. Various techniques have been proposed for distortion correction and efficiency improvement, in order to pursue both of the linearity and power efficiency of the amplifier circuit. There exists one of conventional systems for the amplifier circuit, which is referred to as LINC (Linear Amplification with Nonlinear Components) system. In this system, a transmission signal is divided into two constant-envelope signals, and is synthesized after being amplified at a non-linear amplifier of high power efficiency, so as to pursue both linearity and transmission efficiency.

Here, a description will be given using FIG. 1 of a typical example of an amplifier circuit to which the LINC system is applied. With an amplifier circuit 10 shown in FIG. 1, at a constant-envelope signal generating section 11, two constant-envelope signals Sa(t) and Sb(t) are generated from an input signal S(t). For example, if each constant-envelope signal Sa(t) and Sb(t) is assumed to be given by the following (equation 2) and (equation 3) when the input signal S(t) is represented by the following (equation 1), then each constant-envelope signal Sa(t) and Sb(t) is a constant value in its amplitude direction.

$$S(t)=V(t)\times\cos\{\omega ct+\phi(t)\} \quad \text{(Equation 1)}$$

Here, the maximum value for V(t) is assumed to be Vmax, and the angular frequency of the carrier for the input signal is assumed to be ωc.

$$Sa(t)=V\text{max}/2\times\cos\{\omega ct+\psi(t)\} \quad \text{(Equation 2)}$$

$$Sb(t)=V\text{max}/2\times\cos\{\omega ct+\theta(t)\} \quad \text{(Equation 3)}$$

where $\psi(t)=\phi(t)+\alpha(t)$ and $\theta(t)=\phi(t)-\alpha(t)$.

In FIG. 2, the operation of generating the constant-envelope signals is shown using signal vectors on coordinates in an orthogonal plane, and as shown in this figure, the input signal S(t) is represented as the vector sum of two constant-envelope signals Sa(t) and Sb(t) of which amplitude is Vmax/2.

Referring again to FIG. 1, two constant-envelope signals are respectively amplified by two amplifiers 12 and 13. At this time, assuming the gain of amplifiers 12 and 13 to be G, output signals of amplifiers 12 and 13 are G×Sa(t) and G×Sb(t), respectively. At combining section 14, when the output signals G×Sa(t) and G×Sb(t) are combined, an output signal G×S(t) is obtained.

An example of an amplifier circuit 10a having a similar configuration to this is shown in FIG. 3. In constant-envelope signal generating section 11, baseband signals Sai, Saq, Sbi and Sbq, which constitute constant-envelope signals Sa and Sb after orthogonal demodulation from baseband input signals Si and Sq, are generated by digital signal processing at constant-envelope signal IQ generating section 15. After these baseband signals are converted to analogue signals using D/A converters 16a, 16b, 16c and 16d, the signals are orthogonally modulated by orthogonal modulator 17 having two orthogonal modulators so as to obtain two constant-envelope signals Sa(t) and Sb(t). After each signal is amplified by amplifiers (driver amplifiers) 18a and 18b, final amplification by means of the amplifiers 12 and 13 and combining by means of combining section 14 are carried out, which results in obtainment of an output signal.

At amplifier circuit 10a as described above, constant-envelope signal generation can be achieved with digital signal processing by employing baseband signals of low frequency. However, in the event that errors occur in the gain or phase of the amplifiers in the two systems, vectors of signals after amplification and combining may differ from vectors of an intended output signal, i.e., these errors may become distortion components of signals. Further, at the amplifier circuit 10a, not only is it difficult to predict factors for these errors, but characteristics fluctuate due to an environment such as temperature or the like.

In order to correct this in a conventional amplifier circuit, a method is proposed (for example, refer to Patent Document 1) where, for example, an auxiliary wave signal combined with an input signal upon generation of constant-envelope signals is approximated, two constant-envelope signals are generated by combining the auxiliary wave signal and input signal, the constant-envelope signals are amplified with two amplifiers and combined, and then an output signal or auxiliary wave component is detected to correct errors in characteristics related to the gain or phase of the amplifiers in the two systems.

Patent Document 1: Japanese Patent Publication No. 2758682

DISCLOSURE OF INVENTION

Problems to be Solved by the Invention

However, with the conventional amplifier circuit described above, it is necessary to carry out calculation processing in order to reference signals. At this time, it is necessary to analyze the output signal and auxiliary wave signal of the same band components as the input signal. In particular, when the signal band or the dynamic range is wide, the amount of calculation processing increases, and the circuit scale of the amplifier circuits increases.

It is therefore an object of the present invention to provide an amplifier circuit and amplifying method capable of suppressing an increase in the circuit scale and obtaining an output signal with high power efficiency and little distortion.

Means for Solving the Problem

An amplifier circuit of the present invention adopts a configuration comprising: a constant envelope signal generating section that generates a plurality of constant envelope signals from an input signal; a pilot signal generating section that generates a plurality of pilot signals associated with the generated plurality of constant envelope signals, respectively, the plurality of pilot signals having predetermined amplitudes, predetermined phases and predetermined frequencies, respectively, the phases and frequencies being different from each other; an addition section that adds the plurality of pilot signals to the generated plurality of constant envelope signals, respectively; an amplifying section that amplifies the plurality of constant envelope signals to which the plurality of pilot signals are added; and a correction section that corrects an amplitude or phase of one of the generated, plurality of constant envelope signals using a signal component included in the amplified plurality of constant envelope signals and corresponding to the plurality of pilot signals.

An amplifying method of the present invention comprises the steps of: generating a plurality of constant envelope signals from an input signal; generating a plurality of pilot signals associated with the generated plurality of constant envelope signals, respectively, the plurality of pilot signals having predetermined amplitudes, predetermined phases and predetermined frequencies, respectively, the phases and frequencies being different from each other; adding the plurality of pilot signals to the generated plurality of constant envelope signals; amplifying the plurality of constant envelope signals to which the plurality of pilot signals are added; and correcting an amplitude or phase of one of the generated plurality of constant envelope signals using signal components included in the amplified plurality of constant envelope signals and corresponding to the plurality of pilot signals.

Advantageous Effect of the Invention

According to the present invention, it is possible to suppress the circuit scale of an amplifier circuit and obtain an output signal with high power efficiency and little distortion.

BEST MODE FOR CARRYING OUT THE INVENTION

Embodiments of the present invention will be described in detail below using the drawings.

First Embodiment

Figure 1:
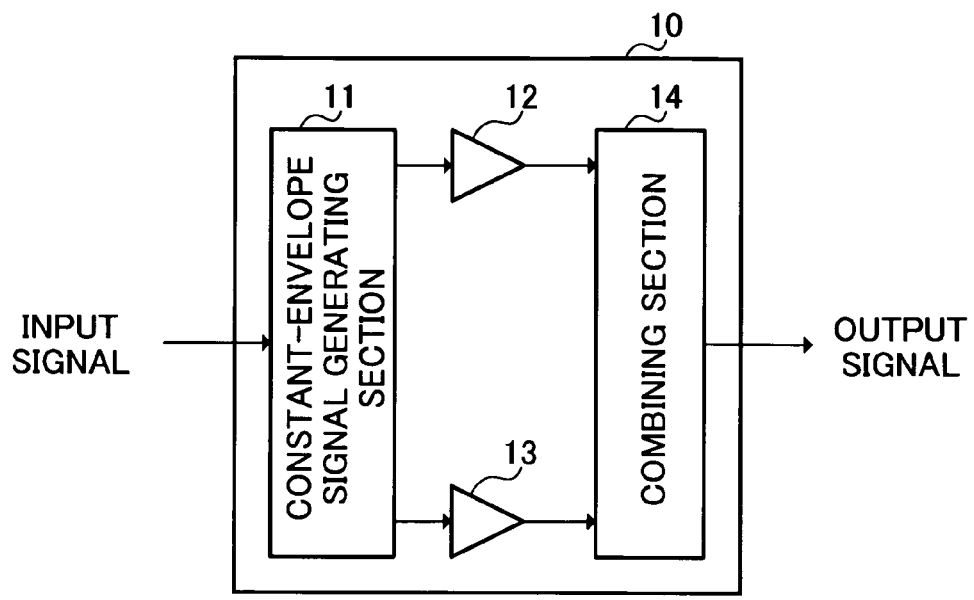
FIG. 1 is a view showing a typical example of a configuration for a conventional amplifier circuit.
Figure 2:
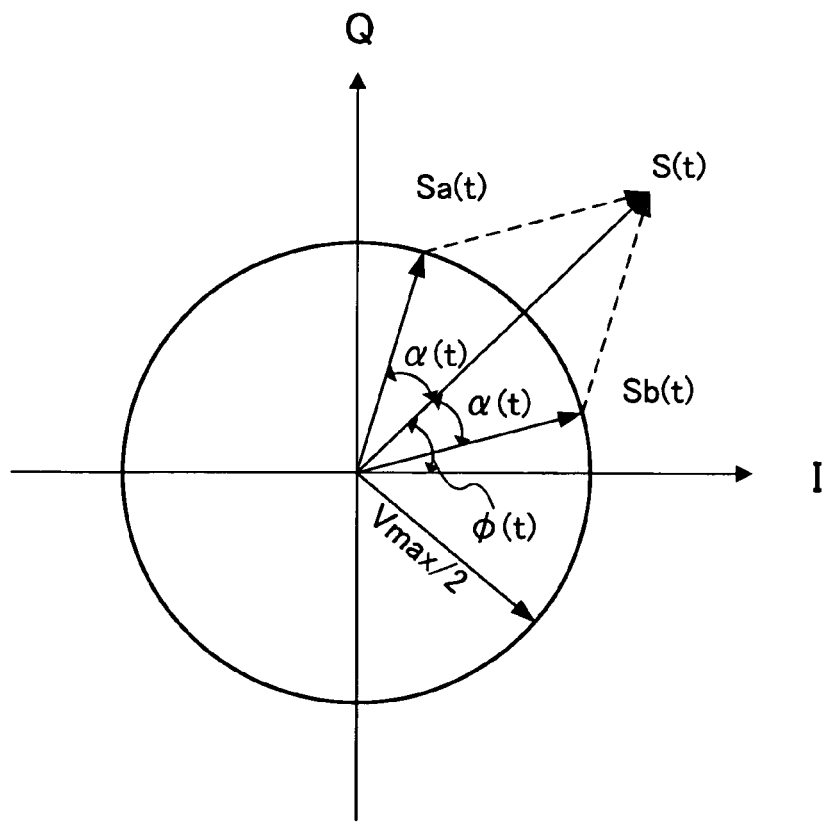
FIG. 2 is a view showing a calculation operation at a conventional amplifier circuit on an orthogonal plane.
Figure 3:
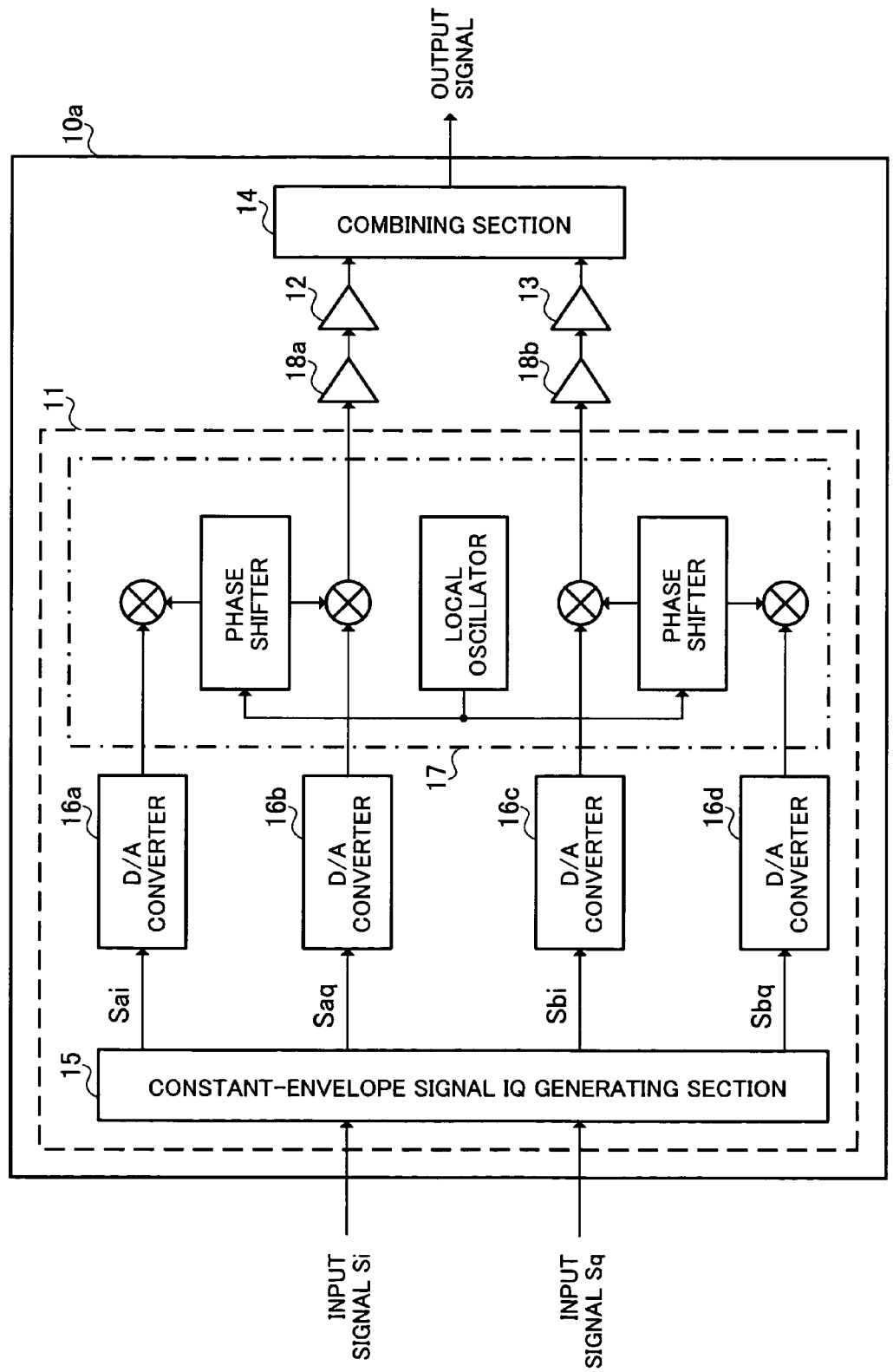
FIG. 3 is a view showing another example of a configuration for a conventional amplifier circuit.
Figure 4:
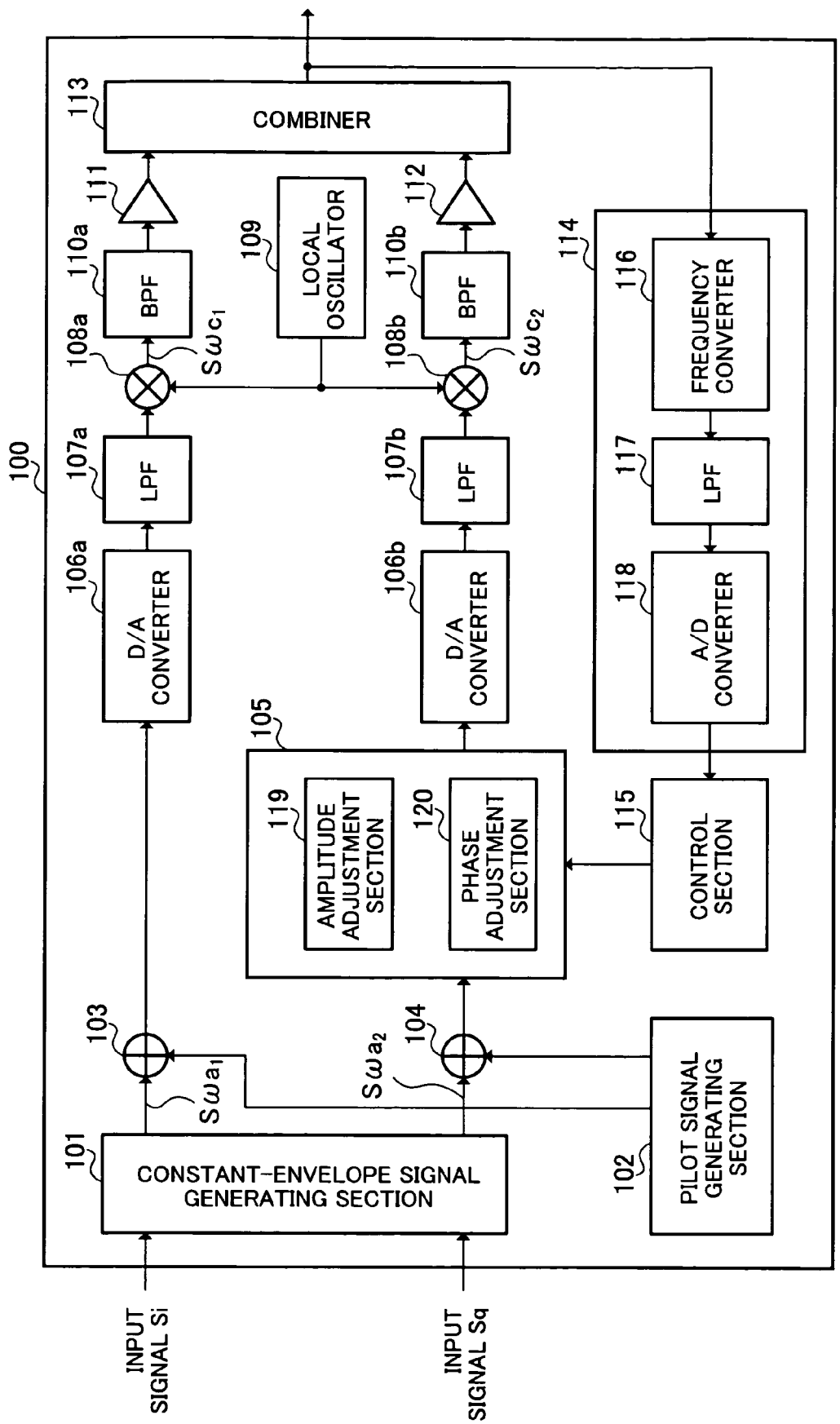
FIG. 4 is a block diagram showing a configuration for an amplifier circuit of a first embodiment of the present invention.

FIG. 4 is a block diagram showing a configuration for an amplifier circuit of a first embodiment of the present invention.

Amplifier circuit 100 shown in FIG. 4 comprises constant-envelope signal generating section 101, pilot signal generating section 102, first addition section 103, second addition section 104, vector adjustment section 105, two D/A converters 106a and 106b, two low-pass filters (LPF) 107a and 107b, two mixers 108a and 108b, local oscillator 109, two band pass filters (BPF) 110a and 110b, first amplifier 111, second amplifier 112, combiner 113, pilot signal detector 114, and control section 115.

Further, pilot signal detector 114 comprises frequency converter 116, LPF 117, and A/D converter 118. Moreover, vector adjustment section 105 comprises amplitude adjustment section 119 and phase adjustment section 120.

Constant-envelope signal generating section 101 generates two constant-envelope signals, i.e. a first constant-envelope signal $S\omega a_1$ and second constant-envelope signal $S\omega a_2$ using baseband input signals Si and Sq. The constant-envelope signals is generated to be equivalent to signals obtained by orthogonally modulating the input signals Si, Sq using a carrier frequency of frequency $\omega a$ at the time of vector combining, and outputs these signals to the first addition section 103 and second addition section 104, respectively.

The pilot signal generating section 102 generates two pilot signals of a frequency outside the band of the input signals Si and Sq, i.e. a first pilot signal and a second pilot signal, and outputs these signals to the first addition section 103 and second addition section 104.

First addition section 103 adds the respectively inputted first constant-envelope signal $S\omega a_1$ and first pilot signal. Second addition section 104 adds the respectively inputted second constant-envelope signal $S\omega a_2$ and second pilot signal.

Vector adjustment section 105 is, for example, a calculation circuit, and changes the gain and phase of the output signal of the second addition section 104 based on control of control section 115 described later, for output to D/A converter 106b.

More specifically, in vector adjustment section 105, amplitude adjustment section 119 adjusts the gain (amplitude direction) of an output signal of second addition section 104 based on control of control section 115, and phase adjustment section 120 adjusts the phase (phase direction) of the output signal of second addition section 104 based on control of control section 115.

Here, constant-envelope signal generating section 101, pilot signal generating section 102, first addition section 103, second addition section 104 and vector adjustment section 105 are digital signal processing circuits configured from, for example, a DSP (Digital Signal Processor), CPU (Central Processing Unit) or ASIC (Application Specific Integrated Circuit) or the like, and their respective operations are processed by means of digital signal calculation.

D/A converter 106a subjects the first constant-envelope signal $S\omega a_1$ to which the first pilot signal has been added by the first addition section 103 to digital to analog conversion.

D/A converter 106b converts an output signal from vector adjustment section 105 that is the second constant-envelope signal $S\omega a_2$ with the second pilot signal added from a digital to analog signal.

LPF 107a and 107b remove the sampling frequency and folding noise components from each output signal from D/A converters 106a and 106b, and outputs the first constant-envelope signal $S\omega a_1$ and second constant-envelope signal $S\omega a_2$ after the removal to mixers 108a and 108b.

Mixers 108a and 108b are, for example, mixer circuits for up-converting frequencies, and mix each output signal from LPF 107a and 107b with a local oscillation signal from local oscillator 109 and frequency-converts (up-converts) the first constant-envelope signal $S\omega a_1$ and second constant-envelope signal $S\omega a_2$ after the mixing to a predetermined frequency for output signals, respectively.

Local oscillator 109 is an oscillation circuit such as a frequency combiner or the like employing a voltage controlled oscillator (VCO) controlled by a phase-locked loop (PLL), and outputs the local oscillation signal to mixers 108a and 108b.

BPF 110a and 110b are filters for passing signals of a desired frequency band and suppressing unnecessary frequency components. The unnecessary frequency components contained in the first constant-envelope signal $S\omega c_1$ and second constant-envelope signal $S\omega c_2$ up-converted by mixers 108a and 108b, i.e. image components generated by mixers 108a and 108b and leakage components of the local oscillation signal are suppressed, and the first constant-envelope signal $S\omega c_1$ and second constant-envelope signal $S\omega c_2$ after the suppression are outputted to first amplifier 111 and second amplifier 112, respectively.

First amplifier 111 amplifies the output signal from BPF 110a and outputs this to combiner 113. Second amplifier 112 amplifies the output signal from BPF 110b and outputs this to combiner 113.

Combiner 113 is a combining means which may be implemented with a four terminal directional coupler employing a distribution constant circuit or with a Wilkinson type combiner or the like, and combines the signals amplified by first amplifier 111 and second amplifier 112 to obtain an output signal of amplifier circuit 100.

Pilot signal detector 114 extracts a pilot signal component from a part of the output signal from combiner 113 and outputs this to control section 115. A component corresponding to the first pilot signal and a component corresponding to the second pilot signal are contained in the pilot signal component.

More specifically, in pilot signal detector 114, frequency converter 116 frequency-converts the pilot signal component contained in the signal obtained from combiner 113 to a low frequency band, and outputs this to LPF 117. Further, LPF 117 suppresses an output signal component from the signal frequency-converted at frequency converter 116, and outputs the pilot signal component to A/D converter 118. Further, A/D converter 118 converts the pilot signal component from LPF 117 from analog to digital for output to control section 115.

Control section 115 is configured from a calculation circuit such as a CPU, DSP, ASIC and the like and a memory and the like, and controls adjustment of the gain and phase of vector adjustment section 105 based on the pilot signal components (i.e. the first pilot signal component and second pilot signal component) outputted by pilot signal detector 114.

More specifically, assuming the amounts of adjustment in the amplitude direction and a phase direction at vector adjustment section 105 are γ and β, respectively, control section 115 sets the adjustment amount γ in an amplitude direction to a value in such a manner that amplitude components of the first pilot signal component and second pilot signal component detected by pilot signal detector 114 are equal to each other, and sets the adjustment amount β in the phase direction to a value in such a manner that phase components of the first pilot signal component and second pilot signal component detected by pilot signal detector 114 are equal to each other.

Next, an operation of amplifier circuit 100 having the above configuration will be described.

First, at constant-envelope signal generating section 101, the first constant-envelope signal $S\omega a_1(t)$ and second constant-envelope signal $S\omega a_2(t)$ are generated from the baseband input signals Si and Sq.

When the signal $S\omega a(t)$ that is obtained by orthogonally modulating the input signals Si, Sq using the carrier frequency of the angular frequency ωa is expressed with the following (equation 4), if the first constant-envelope signal $S\omega a_1(t)$ and second constant-envelope signal $S\omega a_2(t)$ are assumed to be expressed with (equation 5) and (equation 6), the first constant-envelope signal $S\omega a_1(t)$ and second constant-envelope signal $S\omega a_2(t)$ are constant-envelope signals which are constant in the amplitude direction:

$$S\omega a(t) = V(t) \times \cos\{\omega at + \phi(t)\} \quad \text{(Equation 4)}$$

where the maximum value for V(t) is Vmax.

$$S\omega a_1(t) = V\max/2 \times \cos\{\omega at + \psi(t)\} \quad \text{(Equation 5)}$$

$$S\omega a_2(t) = V\max/2 \times \cos\{\omega at + \theta(t)\} \quad \text{(Equation 6)}$$

where $\psi(t) = \phi(t) + \alpha(t)$ and $\theta(t) = \phi(t) - \alpha(t)$.

Here, the first and second pilot signals generated by pilot signal generating section 102 are assumed to be sine wave signals having a common amplitude of P and having different angular frequencies of $(\omega a - \omega p_1)$ and $(\omega a - \omega p_2)$, respectively, i.e. $P_1(t) = P \times \cos\{(\omega a - \omega p_1)t\}$, and $P_2(t) = P \times \cos\{(\omega a - \omega p_2)t\}$. In this event, the output signals $S'\omega a_1(t)$, and $S'\omega a_2(t)$ at first addition section 103 and second addition section 104 are expressed with (equation 7) and (equation 8), respectively.

$$S'\omega a_1(t) = S\omega a_1(t) + P_1(t) \quad \text{(Equation 7)}$$
$$= V\max/2 \times \cos\{\omega at + \psi(t)\} + P \times \cos\{(\omega a - \omega p_1)t\}.$$

$$S'\omega a_2(t) = S\omega a_2(t) + P_2(t) \quad \text{(Equation 8)}$$
$$= V\max/2 \times \cos\{\omega at + \theta(t)\} + P \times \cos\{(\omega a - \omega p_2)t\}$$

Figure 5:
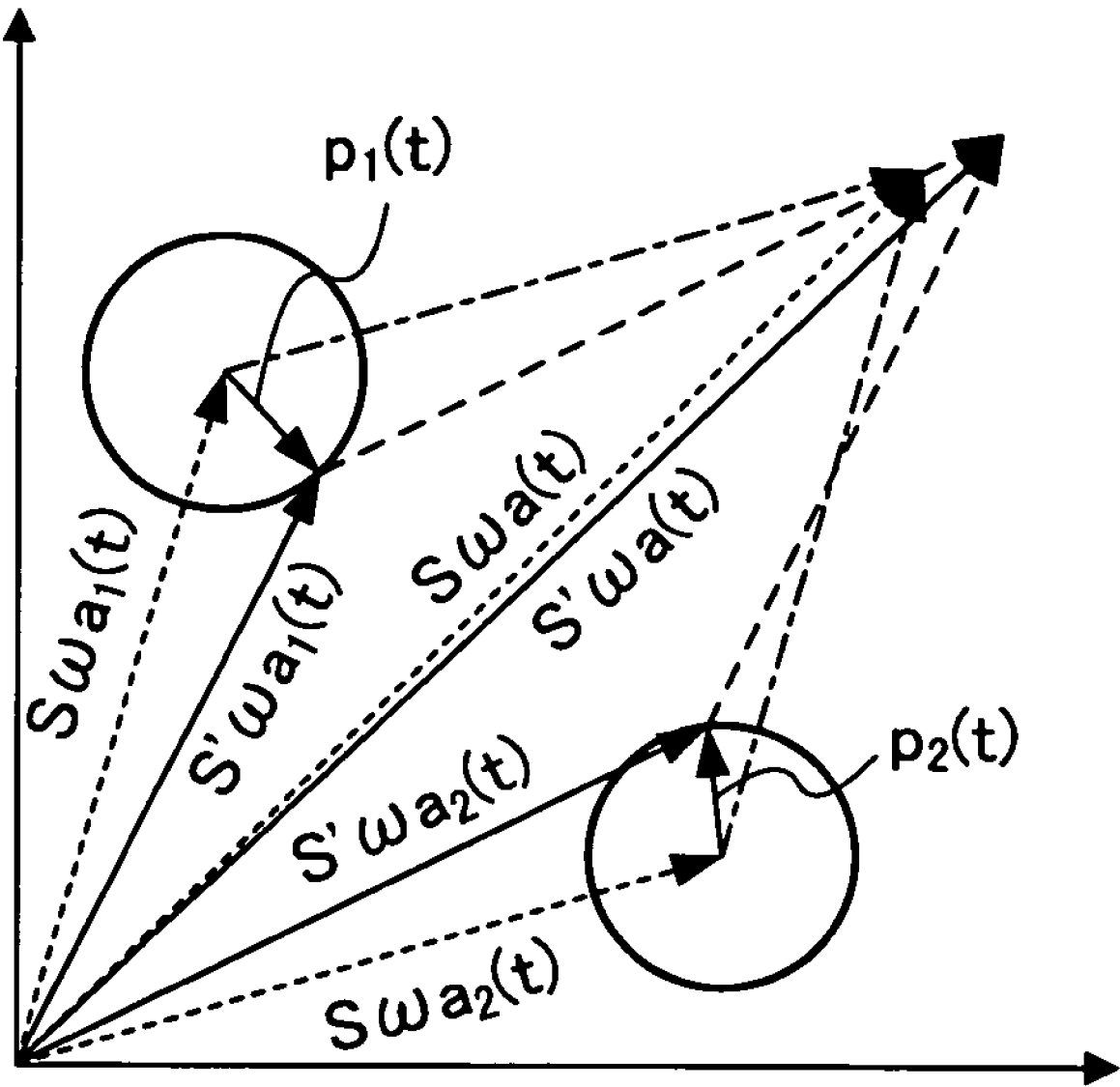
FIG. 5 is a view showing calculation operations in the first embodiment of the present invention using coordinates on an orthogonal plane.

FIG. 5 shows an calculation operation expressed with (equation 4) to (equation 8) using signal vectors on orthogonal plane coordinates. As shown in FIG. 5, the first constant-envelope signal $S\omega a_1(t)$ and second constant-envelope signal $S\omega a_2(t)$ both having the amplitude Vmax with $P_1(t)$ and $P_2(t)$ added are expressed as $S'\omega a_1(t)$ and $S'\omega a_2(t)$. A combination of them is $S'\omega a(t)$.

At vector adjustment section 105, the output signal $S'\omega a_2(t)$ of second addition section 104 is adjusted by, for example, a factor of $\gamma$ in an amplitude direction, and by the amount of phase shift $\beta$ in a phase direction, respectively, based on control of control section 115. The output signal Soutv(t) of vector adjustment section 105 can be expressed using the following (equation 9).

$$Soutv(t)=\gamma \times [Vmax/2 \times \cos\{\omega at+\theta(t)+\beta\}+P\times\cos\{\omega a-\omega p_2\}t+\beta]$$ (equation 9)

Next, at D/A converter 106a, the output signal $S\omega a_1(t)$ of first addition section 103 is converted to an analog signal, and the output signal Soutv(t) of vector adjustment section 105 is converted to an analog signal at D/A converter 106b.

Then, at LPF 107a and 107b, with the signal after the digital to analog conversion, folding noise components that may be outputted from D/A converter 106a and 106b are respectively suppressed.

The carrier frequency of the signal after the suppression of the noise components are then respectively converted to $\omega c$ at mixers 108a and 108b.

At BPF 110a and 110b, unnecessary spurious components such as image components and local oscillation signal leakage components generated by the mixers 108a and 108b are suppressed in the signal after the frequency conversion.

An output signal from BPF 110a is amplified by first amplifier 111, and an output signal from BPF 110b is amplified by second amplifier 112.

At this time, at first amplifier 111 and second amplifier 112, a signal that is a constant-envelope signal having a converted frequency $\omega c$ and added with a pilot signal is amplified. The signals amplified by first amplifier 111 and second amplifier 112 are therefore not a perfect constant-envelope signal but when the amplitudes of the pilot signals are made sufficiently small compared to the constant-envelope signals, envelope fluctuations of the signals amplified here can be made extremely small. For example, if the pilot signal level is made to be a level 40 dB lower than the constant-envelope signals, then envelope fluctuation of the amplified signals will be in the order of 1% of amplitude. It is therefore possible for first amplifier 111 and second amplifier 112 to be used with high power efficiency.

Output signals from first amplifier 111 and second amplifier 112 are synthesized at combiner 113. An output signal is then obtained of amplifier circuit 100.

Here, assuming the gain and phase shift amount from D/A converter 106a to first amplifier 111 to be Ga and Ha, respectively, and the gain and phase shift amount from D/A converter 106b to second amplifier 112 to be Gb and Hb, respectively, the output signal $Souta_1$ from first amplifier 111 and the output signal $Souta_2$ from second amplifier 112 can be expressed as (equation 10) and (equation 11), respectively.

$$Souta_1 = Ga\times[Vmax/2\times\cos\{\omega ct+\psi(t)+Ha\}+P\times\cos\{(\omega c-\omega p_1)t+Ha\}]$$ (Equation 10)

$$Souta_2 = Gb\times\gamma\times[Vmax/2\times\cos\{\omega ct+\theta(t)+\beta+Hb\}+P\times\cos\{(\omega c-\omega p_2)t+\beta+Hb\}]$$ (Equation 11)

Therefore, the output signal S'(t) of combiner 113 is a signal where two signals expressed with (equation 10) and (equation 11) are in-phase added, and can be expressed with the following (equation 12).

$$S'(t) = Ga \times [Vmax/2 \times \cos\{\omega ct + \psi(t) + Ha\} +$$ (equation 12)
$$Gb \times \gamma \times [Vmax/2 \times \cos\{\omega ct + \theta(t) + \beta + Hb\} +$$
$$Ga \times P \times \cos\{(\omega c - \omega p_1)t + Ha\} +$$
$$Gb \times \gamma \times P \times \cos\{(\omega c - \omega p_2)t + \beta + Hb\}$$

At this time, when Ga=Gb×γ, and Ha=Hb+β, the first term and second term on the right side of (equation 12) are analogous to (equation 2) and (equation 3) which express constant-envelope signals to constitute (equation 1) when combined, and (equation 12) can be converted to give (equation 13).

$$S'(t) = Ga \times V(t) \times \cos\{\omega ct + \varphi(t) + Ha\} +$$ (equation 13)
$$Ga \times P \times \cos\{(\omega c - \omega p_1)t + Ha\} +$$
$$Ga \times P \times \cos\{(\omega c - \omega p_2)t + Ha\}$$

The first term on the right side of (equation 13) described above constitutes a signal component that is the input signal subjected to the orthogonal modulation with a carrier of the angular frequency $\omega c$ to give a signal of the gain Ga and the phase shift amount Ha, i.e. a desired signal component amplified with the gain Ga.

Namely, in this embodiment, part of the output signal of amplifier circuit 100 is inputted to pilot signal detector 114, the pilot signal component indicated by the third term and fourth term on the right side of (equation 12) is detected by pilot signal detector 114, and control of vector adjustment section 105 is carried out by control section 115 in such a manner that Ga=Gb×γ and Ha=Hb+β are met.

At frequency converter 116 of pilot signal detector 114, the output signal is converted to a low frequency band. For example, assuming the local oscillation frequency to be $\omega c-2\times\omega p_2+\omega p_1$, the angular frequency of the third term on the right side of (equation 12) is $2\times(\omega P_2-\omega P_1)$, the angular frequency of the fourth term is $\omega P_2-\omega P_1$, and the angular frequency of the first term and second term is $2\times\omega p_2-\omega p_1$. When the components of the frequency-converted first term and second term are removed by LPF 117, the output signal of LPF 117 (the pilot signal component) becomes $Ga\times P\times\cos\{(\omega P_2-\omega P_1)t+Ha\}+Gb\times\gamma\times P\times\cos\{(\omega P_2-\omega P_1)t+\beta+Hb\}$.

Figure 6A:
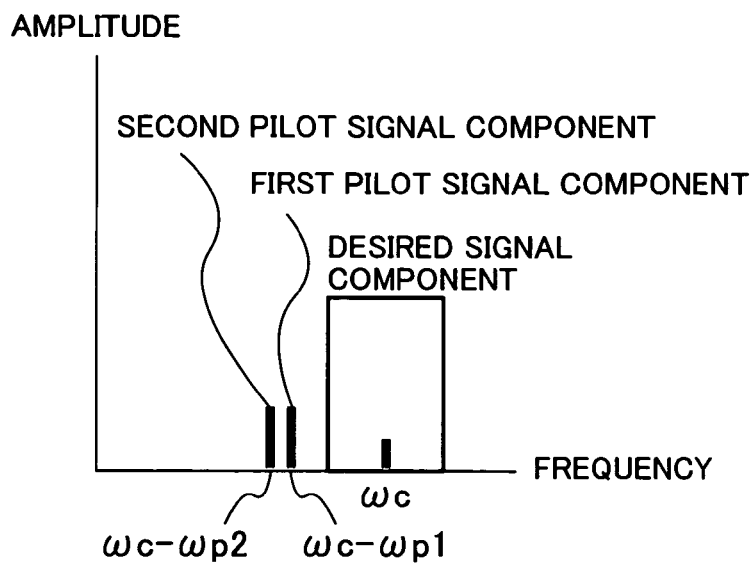
FIG. 6A is a view showing a spectrum for an output signal of the amplifier circuit of the first embodiment of the present invention.
Figure 6B:
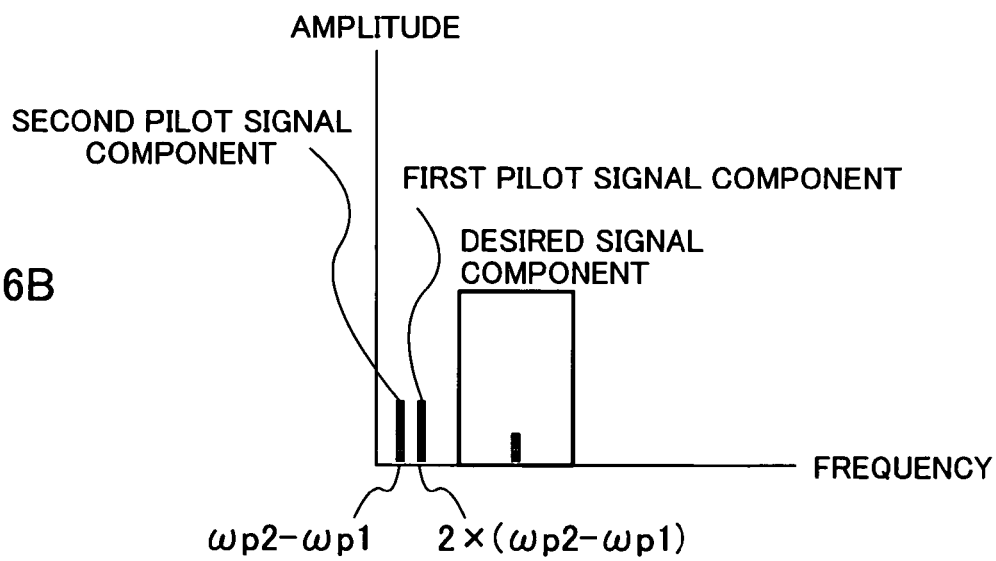
FIG. 6B is a view showing a spectrum for an output signal of a frequency converter of the amplifier circuit of the first embodiment of the present invention.
Figure 6C:
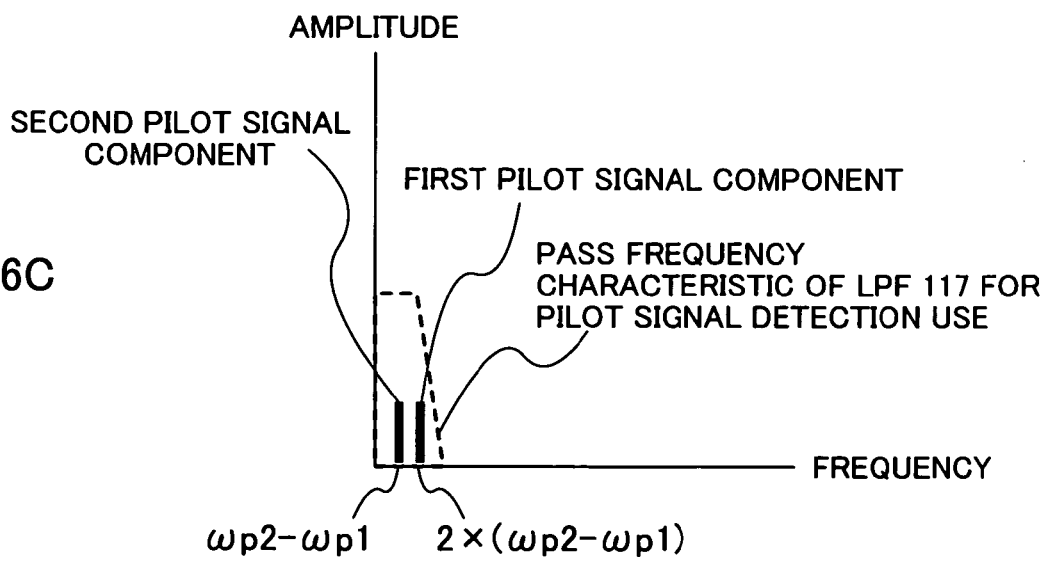
FIG. 6C is a view showing a spectrum for an output signal of a low-pass filter of the amplifier circuit of the first embodiment of the present invention.

FIG. 6A, FIG. 6B and FIG. 6C are views showing spectrums of output signals of respective parts at amplifier circuit 100 of this embodiment. The spectrums are shown in FIG. 6A for an output signal of amplifier circuit 100, in FIG. 6B for an output signal of frequency converter 116, and in FIG. 6C for an output signal of LPF 117. It can be understood that the frequency-converted pilot signal component can be easily separated and extracted by LPF 117.

A/D converter 118 then converts the pilot signal component obtained through the separation to a digital signal for output to control section 115.

Control section 115 then controls adjustment of the gain γ and phase shift amount β performed by vector adjustment section 105, in such a manner that the amplitude components Ga×P and Gb×γ×P and the phase components Ha and β+Hb at pilot signal component $Ga\times P\times\cos\{(\omega p_2-\omega p_1)t+Ha\}+Gb\times\gamma\times P\times\cos\{(\omega p_2-\omega P_1)t+\beta+Hb\}$ converted to a digital signal are equal to each other, respectively.

Namely, as a result of this operation, the signal expressed with (equation 13) can be obtained as an output signal of amplifier circuit 100.

At this time, assuming $\omega p_2 - \omega p_1 = 2n \times 5$ kHz even in the event that, for example, the bandwidth of V (t)×cos {ωct+ φ(t) } is a broadband of more than several MHz, then $2 \times (\omega p_2 - \omega p_1) = 2\pi \times 10$ kHz. Assuming the sampling frequency of A/D converter 118 to be 80 kHz, then sampling of the pilot signal component of eight times over-sampling or more is possible. Also in control section 115, it is possible to perform calculation processing for adjusting the amplitude component and phase component with a frequency that is sufficiently low compared to the bandwidth of the signal.

According to this embodiment, gain differences and phase differences in two systems of LINC system amplifier circuit 100 is calculated by comparison of a pilot signal which is a simple signal such as a sine wave or the like at first control section 115. Adjustment (correction) of the amplitude component and phase component is then carried out by vector adjustment section 105 based on the calculated gain differences and phase differences. This means that large scale calculation circuits for correction use are no longer necessary, the circuit scale of amplifier circuit 100 can be made small, and an output signal S'(t) of high output efficiency and little distortion can be obtained.

In the above description, it is assumed that the combiner 113 is ideal in-phase combining means, but according to this embodiment, it is possible to correct the gain differences and phase differences even in cases where there are those differences at the time of combining at the combiner 113.

In the above description, the gain and phase are corrected at vector adjustment section 105 but the same operations and effects can be obtained using a variable gain amplifier and variable phase shifter or the like employing an analog circuit. For example, if a configuration of controlling a bias of first amplifier 111 and second amplifier 112 is adopted as a variable gain means, it is possible to further improve the power efficiency.

In the above description, phase adjustment section 120 is used as a variable phase-shifting means but the same operations and effects as described above can be also obtained using a variable delay means in the event that a cause of the phase differences is mainly based on differences in the amount of delay.

Further, in the above description, a combiner 113 for the in-phase combining is used but this by no means limits phase characteristics. For example, it is also possible to obtain the same operations and effects if a constant-envelope signal is generated in consideration of the phase shift amount even in cases where a directional coupler that performs combining after a ninety-degree phase shift is used in place of combiner 113.

Second Embodiment

Figure 7:
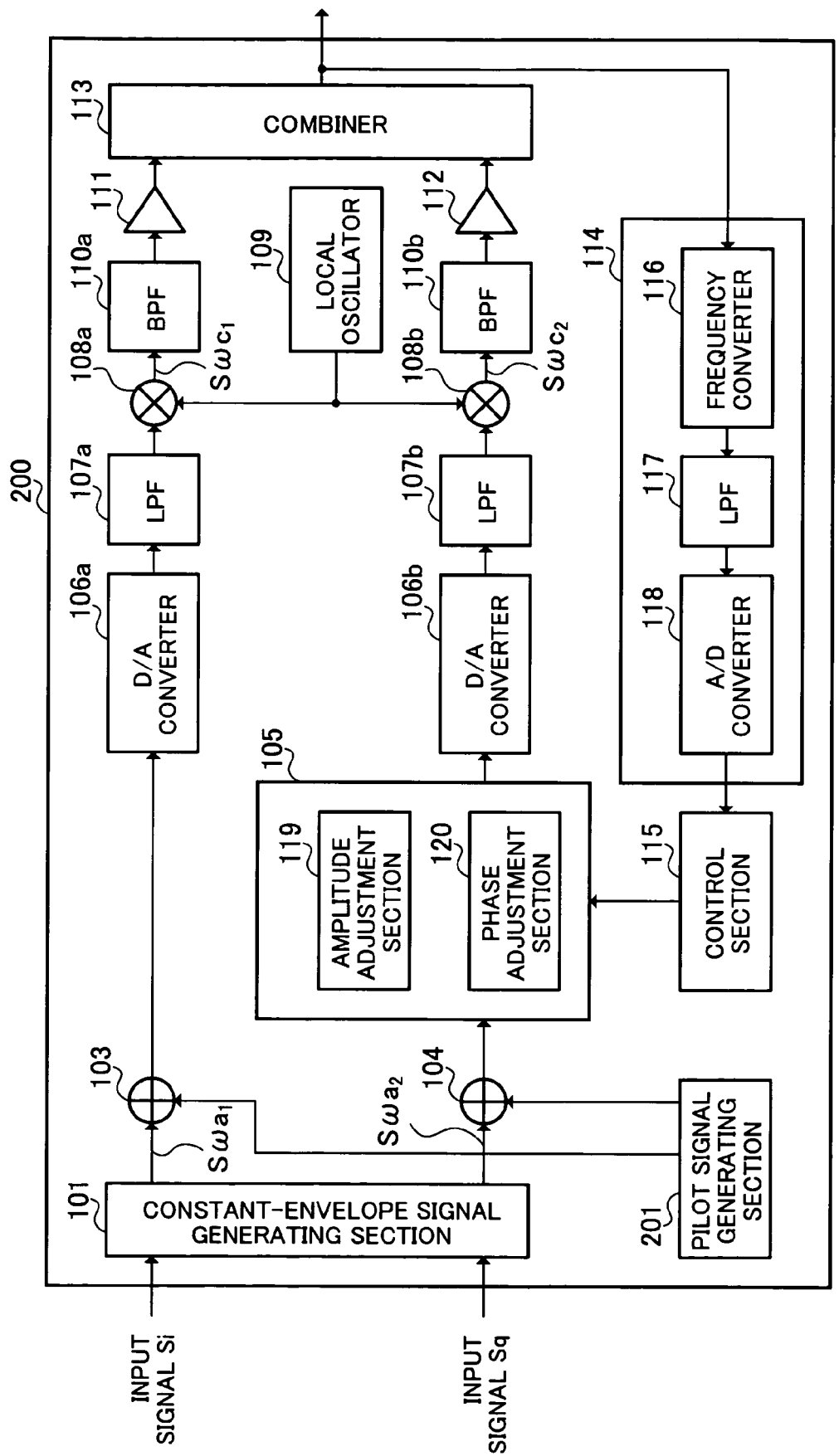
FIG. 7 is a block diagram showing a configuration for an amplifier circuit of a second embodiment of the present invention.

FIG. 7 is a block diagram showing a configuration for an amplifier circuit of a second embodiment of the present invention. The amplifier circuit of this embodiment has a basic configuration similar to amplifier circuit 100 described in the first embodiment, the same reference numerals are assigned to the same structural elements, and detailed description thereof is therefore omitted.

Amplifier circuit 200 shown in FIG. 7 has pilot signal generating section 201 in place of pilot signal generating section 102 of amplifier circuit 100 shown in FIG. 4.

A feature of this embodiment is that two pilot signals are generated in such a manner that pilot signal components cancel each other out after combined in the event that any differences in gain and phase are not generated from respective signals being outputted from first addition section 103 and second addition section 104 until the signals are combined by the combiner 113.

In the following, an operation of amplifier circuit 200 having the above configuration will be described. In addition, similar operations to those of the first embodiment described above will not be described in detail.

Assuming the first and second pilot signals generated by pilot signal generating section 201 to be sine wave signals having a common amplitude of P, having a common angular frequency of $(\omega a - \omega p_1)$, and having phases with a 180 degree difference therebetween, i.e., $P_1(t) = P \times \cos\{(\omega a - \omega p_1)t\}$ and $P_2(t) = P \times \cos\{(\omega a - p_1)t + \pi\}$. In this event, the output signals S'ωa$_1$(t), S'ωa$_2$(t) at first addition section 103 and second addition section 104 can be expressed with (equation 14) and (equation 15), respectively.

$$S'\omega a_1(t) = S\omega a_1(t) + P_1(t) \quad \text{(Equation 14)}$$
$$= Vmax/2 \times \cos\{\omega at + \psi(t)\} + P \times \cos\{(\omega a - \omega p_1)t\}$$

$$S'\omega a_2(t) = S\omega a_2(t) + P_2(t) \quad \text{(equation 15)}$$
$$= Vmax/2 \times \cos\{\omega at + \theta(t)\} + P \times \cos\{(\omega - \omega p_1)t + \Pi\}$$

Figure 8:
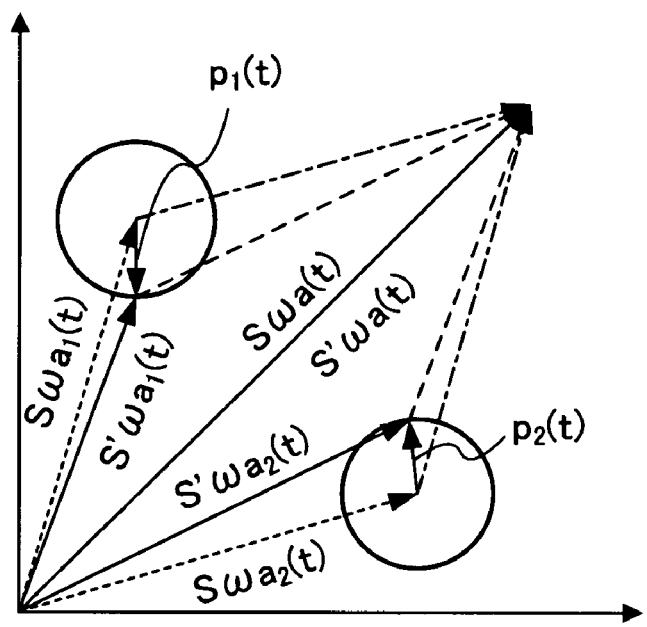
FIG. 8 is a view showing calculation operations occurring in the second embodiment of the present invention using coordinates on an orthogonal plane.

FIG. 8 illustrates the calculation operation expressed with (equation 4) to (equation 6) described in the first embodiment and (equation 14) to (equation 15) using signal vectors on orthogonal plane coordinates. As shown in FIG. 8, the first constant-envelope signal Sωa$_1$(t) and second constant-envelope signal Sωa$_2$(t) of the respective amplitudes Vmax with $P_1(t)$ and $P_2(t)$ added are expressed as S'ωa$_1$(t) and S'ωa$_2$(t). A combination of them is S'ωa(t).

Further, $P_1(t)$ and $P_2(t)$ have the same amplitude and are different each other in phase by 180 degrees, and as such, cancel each other out upon in-phase combining, and it is understood that Sωa(t) and S'ωa(t) indicate the same vector coordinate.

At vector adjustment section 105, the output signal Sωa$_2$(t) of second addition section 104 is adjusted by, for example, a factor of γ in an amplitude direction, and by the phase shift amount β in a phase direction, respectively, based on control of control section 115. The output signal Soutv(t) of vector adjustment section 105 can be expressed using the following (equation 16).

$$Soutv(t) = \gamma \times [Vmax/2 \times \cos\{\omega at + \theta(t) + \beta\} + P \times \cos\{\omega a - \omega p_1\}t + \pi + \beta]  \quad \text{(equation 16)}$$

Further, assuming the gain and phase shift amount from D/A converter 106a to first amplifier 111 to be Ga and Ha, and the gain and phase shift amount from D/A converter 106b to second amplifier 112 to be Gb and Hb, the output signal Souta$_1$ from first amplifier 111 and the output signal Souta$_2$ from second amplifier 112 can be expressed as (equation 17) and (equation 18), respectively.

$$\text{Souta}_1 = Ga \times [V\text{max}/2 \times \cos\{\omega ct + \psi(t) + Ha\} + P \times \cos\{(\omega c - \omega p_1)t + Ha\}]$$ (Equation 17)

$$\text{Souta}_2 = Gb \times \gamma \times [V\text{max}/2 \times \cos\{\omega ct + \theta(t) + \beta + Hb\} + P \times \cos\{(\omega c - \omega p_1)t + \pi + \beta + Hb\}]$$ (equation 18)

Therefore, the output signal S'(t) of combiner 113 is a signal where two signals expressed with (equation 17) and (equation 18) are in-phase added, and can be expressed with the following (equation 19).

$$S'(t) = Ga \times [V\text{max}/2 \times \cos\{\omega ct + \psi(t) + Ha\} + $$
$$Gb \times \gamma \times [V\text{max}/2 \times \cos\{\omega ct + \theta(t) + \beta + Hb\} + $$
$$Ga \times P \times \cos\{(\omega c - \omega p_1)t + Ha\} + $$
$$Gb \times \gamma \times P \times \cos\{(\omega c - \omega p_1)t + \Pi + \beta + Hb\}$$ (equation 19)

At this time, assuming Ga=Gb×γ and Ha=Hb+β, the first term and second term on the right side of (equation 19) are analogous to (equation 2) and (equation 3) which express constant-envelope signals to turn to be (equation 1) when combined, and the third term and fourth term on the right side give a sine wave signal of an equal amplitude and phases with a 180 degree difference therebetween, and therefore (equation 19) can be converted to give (equation 20).

$$S'(t) = Ga \times V(t) \times \cos\{\omega ct + \phi(t) + Ha\}$$ (Equation 20)

Namely, in this embodiment, part of the output signal of amplifier circuit 200 is inputted to pilot signal detector 114, the pilot signal component indicated by the third term and fourth term on the right side of (equation 19) is detected by pilot signal detector 114, and control of vector adjustment section 105 is carried out by control section 115 in such a manner that Ga=Gb×γ and Ha=Hb+β are met.

Figure 9:
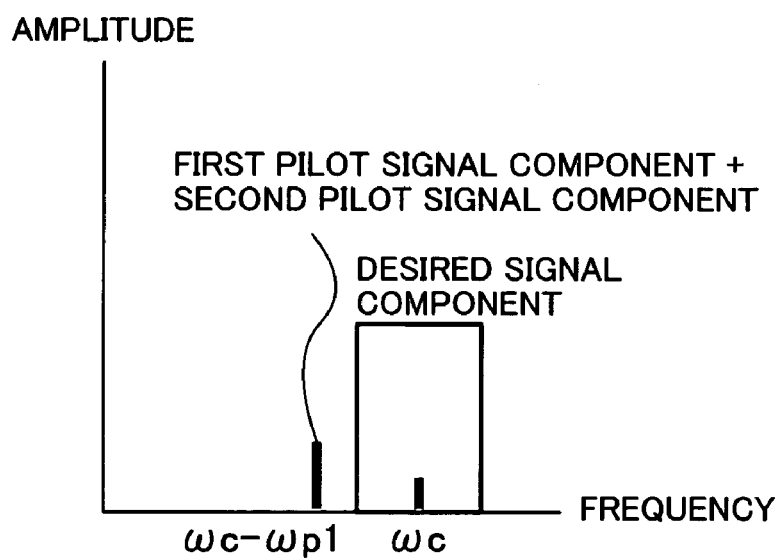
FIG. 9 is a view showing a spectrum for an output signal of the amplifier circuit of the second embodiment of the present invention.

FIG. 9 is a view showing spectrums of output signals for amplifier circuit 200 of this embodiment. The third item and fourth item on the right side of (equation 19) are of the same frequency. A spectrum for the pilot signal component is therefore generated within ωc−ωp1 when a condition of Ga=Gb×γ and Ha=Hb+β is not satisfied.

At frequency converter 116 of pilot signal detector 114, the output signal is converted to a low frequency band. For example, assuming the local oscillation frequency to be ωc−ωp2−2π×10 kHz, the angular frequency of the third term and fourth term on the right side of (equation 19) becomes 2×10 kHz, and the angular frequency of the first and second terms becomes ωp1+2π×10 kHz. When components of the frequency-converted first term and second term are removed by LPF 117, the output signal of LPF 117 (the pilot signal component) becomes Ga×P×cos {(2π×10 kHz) t+Ha}+Gb× γ×P×cos {(2π×10 kHz) t+π+β+Hb}.

A/D converter 118 then converts the pilot signal component obtained through the separation to a digital signal for output to control section 115.

Control section 115 then controls adjustment of the gain γ and phase shift amount β by vector adjustment section 105 in such a manner that the amplitude components Ga×p and Gb×γ×P and the phase components Ha and β+Hb at the pilot signal component Ga×P×cos {(2π×10 kHz) t+Ha}+Gb×γ×P× cos {(2π×10 kHz) t+π+β+Hb} converted to a digital signal are equal to each other respectively, i.e., so that the pilot signal components are of the same amplitude but opposite phases and are therefore cancelled out.

Namely, as a result of this operation, the signal expressed with (equation 20), i.e. the signal with the pilot signal component cancelled, can be obtained as the output signal of amplifier circuit 200.

According to this embodiment, gain differences and phase differences in two systems of LINC system amplifier circuit 200 is calculated by comparison of a pilot signal which is a simple signal such as a sine wave or the like using first control section 115. Adjustment (correction) of the amplitude component and phase component is then carried out by vector adjustment section 105 based on the calculated gain differences and phase differences. This means that any large scale calculation circuits for correction use are no longer necessary, the circuit scale of amplifier circuit 200 can be made small, the radiation level for the pilot signal can be made small, and an output signal S'(t) of high power efficiency and little distortion can be obtained.

In the above description, the configuration is such that a pilot signal component converted to a frequency of 10 kHz is outputted at control section 115 but this configuration is by no means limiting. For example, even when a detection section is provided at pilot signal detector 114, a detection voltage obtained by the pilot signal component detection is outputted at control section 115, and the control is exerted to adjust the gain γ and the phase shift amount β by vector adjustment section 105 in such a manner that the detection voltage becomes a minimum, it is possible to make the pilot signal component minimum in the same manner, and the same operations and effects as in the above can be obtained.

Third Embodiment

Figure 10:
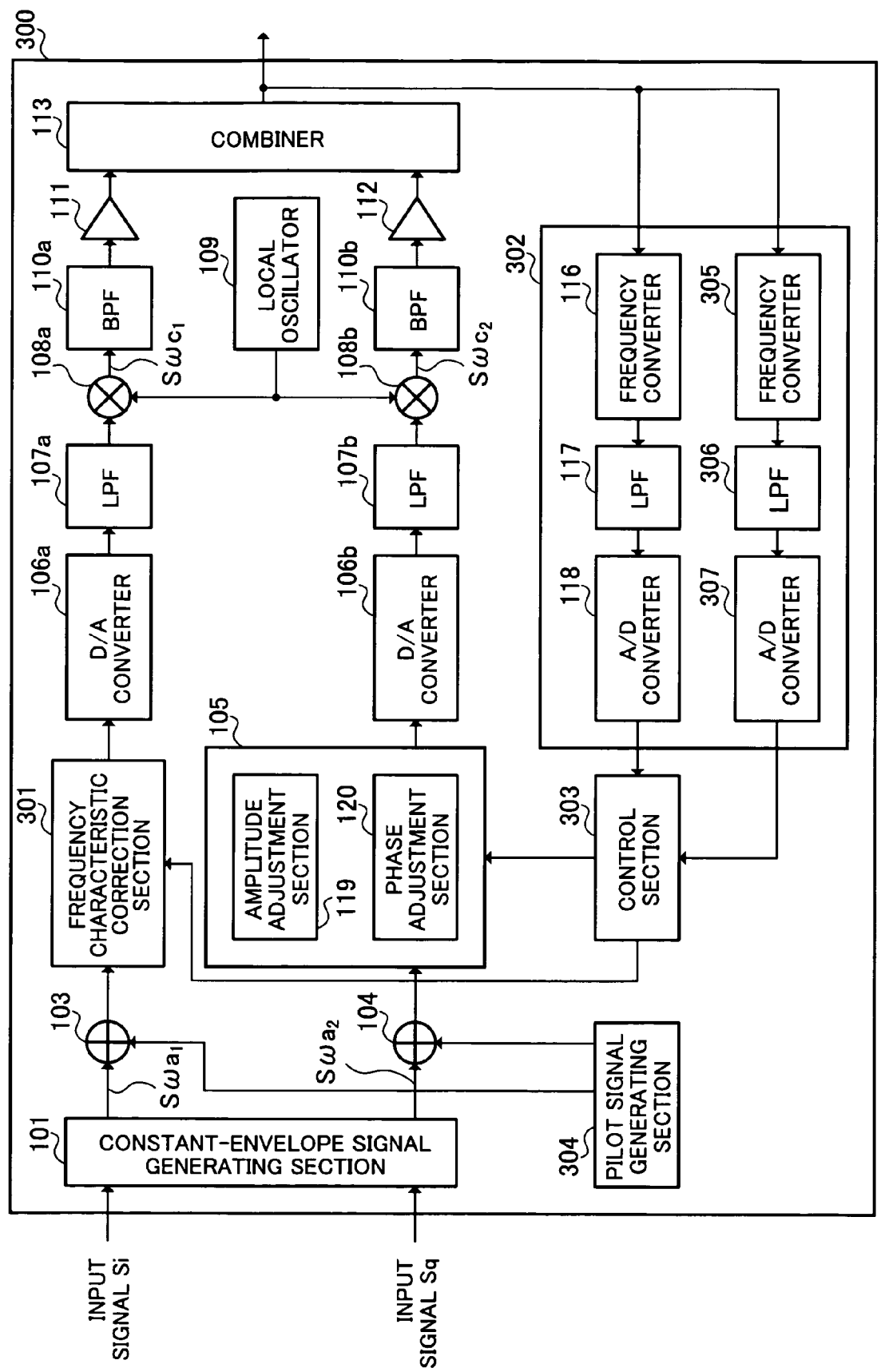
FIG. 10 is a block diagram showing a configuration for an amplifier circuit of a third embodiment of the present invention.

FIG. 10 is a block diagram showing a configuration for an amplifier circuit of a third embodiment of the present invention. The amplifier circuit of this embodiment has a basic configuration similar to amplifier circuit 100 described in the first embodiment, the same reference numerals are assigned to the same structural elements, and detailed description thereof is therefore omitted.

Amplifier circuit 300 shown in FIG. 10 adds frequency characteristic correction section 301 to the configuration of amplifier circuit 100 shown in FIG. 4, and adopts a configuration provided with pilot signal detection section 302, control section 303 and pilot signal generating section 304 in place of pilot signal detector 114, control section 115 and pilot signal generating section 102. Further, pilot signal detection section 302 also adopts a configuration where frequency converter 305, LPF 306 and A/D converter 307 are added to the configuration of pilot signal detector 114 described in the first embodiment.

Pilot signal generating section 304 generates two pilot signals (a first pilot signal and second pilot signal) of a frequency outside the band on the lower side of the input signal, and two pilot signals (a third pilot signal and fourth pilot signal) of a frequency outside the band on the upper side of the input signal. Further, pilot signal generating section 304 outputs the first pilot signal and the third pilot signal to first addition section 103 and outputs the second pilot signal and the fourth pilot signal to second addition section 104.

First addition section 103 and second addition section 104 add the respectively inputted constant-envelope signals and pilot signals.

Frequency characteristic compensation section 301 is, for example, a calculation circuit, and changes frequency characteristics of the gain and phase of the output signal of first addition section 103 based on control of control section 303, and then outputs this to D/A converter 106a. Frequency characteristic correction section 301 is a digital signal processing circuit comprised of, for example, DSP, CPU, ASIC, or the like, carrying out processing for correction of the frequency characteristics using computation of digital signals. Further, frequency characteristic correction section 301 changes the frequency characteristics for the gain and phase by, for example, changing coefficients of digital filters using digital signal processing.

Pilot signal detection section 302 extracts a pilot signal component from part of the output signal outputted by combiner 113 and outputs this to control section 303.

More specifically, in pilot signal detection section 302, frequency converter 116 frequency-converts into a low frequency band a pilot signal component of a lower frequency outside the band contained in the inputted signal and outputs this to LPF 117. Further, LPF 117 suppresses an output signal component from the frequency-converted signal at frequency converter 116 and outputs the pilot signal component of the low frequency outside the band to A/D converter 118. Moreover, A/D converter 118 converts the pilot signal component from LPF 117 from analog to digital for output to control section 303.

Further, in pilot signal detection section 302, frequency converter 305 frequency-converts to a low frequency band a pilot signal component of a upper frequency outside the band contained in the inputted signal, outputs this to LPF 306. Moreover, LPF 306 suppresses the output signal component from the frequency-converted signal at frequency converter 305 and outputs the pilot signal component of the upper frequency outside the band to A/D converter 307. Further, A/D converter 307 converts the pilot signal component from LPF 306 from analog to digital for output to control section 303.

Control section 303 controls adjustment of the gain and phase at vector adjustment section 105 and correction of the frequency characteristics at frequency characteristic correction section 301 based on the first to fourth pilot signal components outputted by pilot signal detection section 302.

More specifically, assuming the amount of adjustment in an amplitude direction and a phase direction at vector adjustment section 105 to be $\gamma$ and $\beta$, respectively, control section 303 sets the amount of adjustment $\gamma$ in an amplitude direction to a value in such a manner that the amplitude components of the first pilot signal component and the second pilot signal component detected by pilot signal detection section 302 are equal to each other, and sets the amount of adjustment $\beta$ in a phase direction to a value in such a manner that the phase components of the first pilot signal component and the second pilot signal component detected by pilot signal detector 302 are equal to each other.

Further, in the event that there are differences in the frequency characteristics from first addition section 103 to first amplifier 111 and from second addition section 104 to second amplifier 112, control section 303, determines, for example, digital filter coefficients at frequency characteristic correction section 301 in such a manner that the levels of the third pilot signal component and fourth pilot signal component of a upper frequency outside the band detected by pilot signal detection section 302 are made minimum, and notifies it to frequency characteristic correction section 301.

In the following, a description is given using FIG. 11 to FIG. 14 of correction of frequency characteristics of gain and phase in this embodiment.

Figure 11:
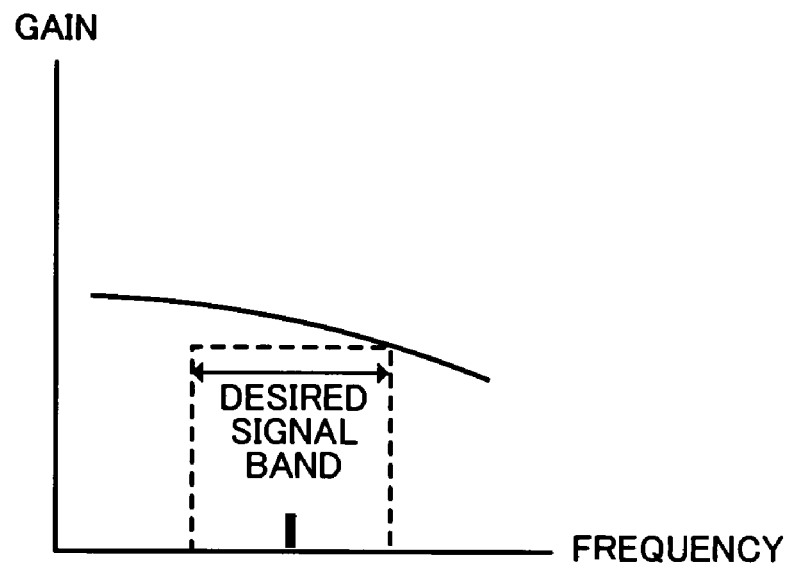
FIG. 11 is a view showing an example of gain frequency characteristics of a typical high-frequency circuit.

FIG. 11 is a view showing an example of gain frequency characteristics of a typical high frequency circuit such as an amplifier or mixer. As shown in FIG. 11, in the event that the gain of the high frequency circuit varies depending on a frequency, variation also exists in the frequency characteristics. Because of this, it is necessary to take into consideration that, even if the gain and phase are corrected using only the pilot signal outside the band on one side, these differences become larger at the frequency band on the upper side of the desired signal and distortion occurs in the output signal.

Figure 12:
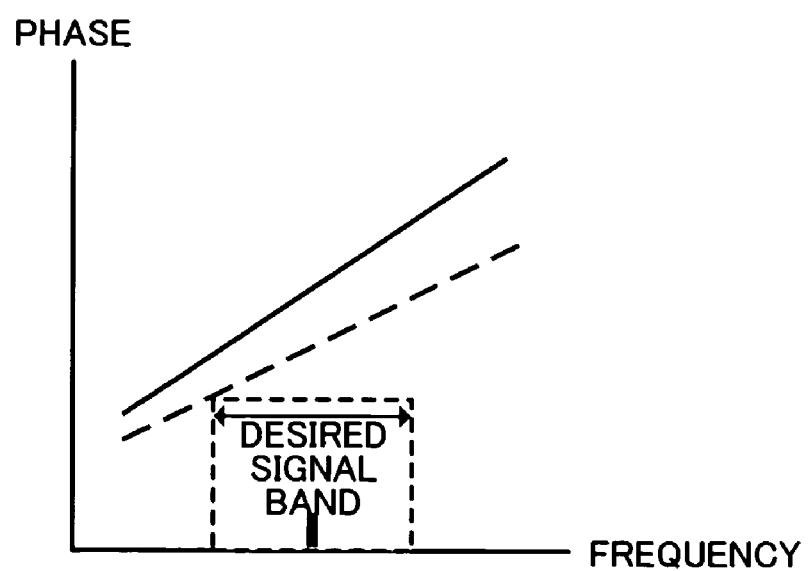
FIG. 12 is a view showing an example of phase frequency characteristics for two paths of different amounts of delay.

FIG. 12 is a view showing an example of phase frequency characteristics of two paths (shown by a solid line and a broken line) of different amounts of delay. In the event that an electrical circuit is implemented on a printed circuit board, differences occur in the amount of delay between a plurality of paths depending on a difference between the lengths of the transmission paths. In this event, as shown in FIG. 12, the difference in phase varies depending on a frequency. Because of this, it is necessary to take into consideration that, even if the phase is corrected using only the pilot signal outside the band on one side, these differences become larger at the frequency band on the upper side of the desired signal and distortion occurs in the output signal.

Here, at the amplifier circuit 300 of this embodiment, the frequency characteristics are corrected using the pilot signals of the frequency components outside the band on the lower side and upper sides of the desired signal.

Figure 13:
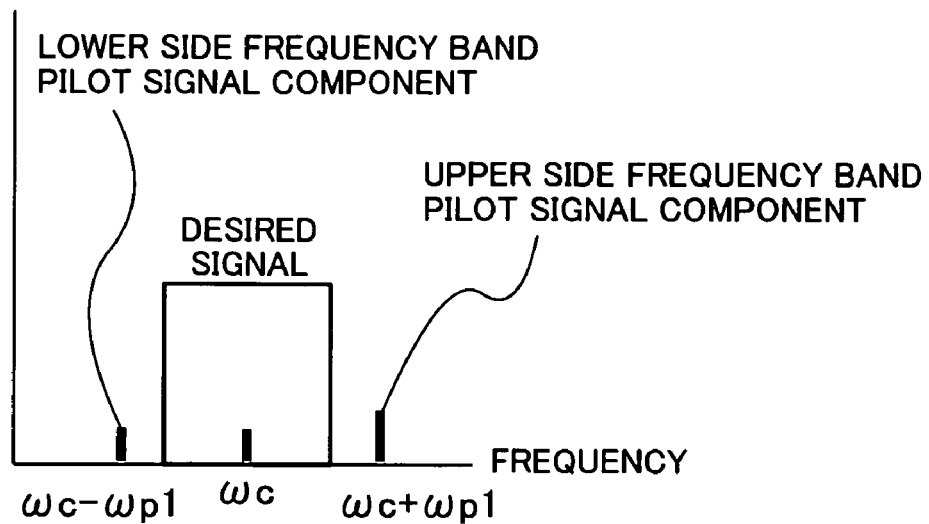
FIG. 13 is a view showing a spectrum for an output signal of the amplifier circuit of the third embodiment of the present invention.

For example, the first pilot signal $P_1(t)$ and second pilot signal $P_2(t)$ of the frequency outside the band on the lower side are assumed to be sine wave signals having a common amplitude of P, having a common angular frequency of $(\omega a - \omega p_1)$ and having phases with a 180 degree difference therebetween, i.e. $P_1(t)=P\times\cos\{(\omega a-\omega p_1)t\}$ and $P_2(t)=P\times\cos\{(\omega a-\omega p_1)t+\pi\}$. Further, the third pilot signal $P_3(t)$ and fourth pilot signal $P_4(t)$ of the frequency outside the band on the upper side are assumed to be sine wave signals having a common amplitude of P, having a common angular frequency of $(\omega a+\omega p_1)$ and having phases with a 180-degree difference therebetween, i.e. $P_3(t)=P\times\cos\{(\omega a+\omega p_1)t\}$ and $P_4(t)=P\times\cos\{(\omega a+\omega p_1)t+\pi\}$. The spectrum of the output signal of amplifier circuit 300 at this time is shown in FIG. 13.

The gain and phase of the components of the first pilot signal $P_1(t)$ and second pilot signal $P_2(t)$ of the frequency outside the band on the lower side included in the output signal at vector adjustment section 105 are adjusted by control section 303 in such a manner that the components cancel each other out. This operation is similar to the operation described in the second embodiment.

On the other hand, the following operation is carried out for the components of the third pilot signal $P_3(t)$ and fourth pilot signal $P_4(t)$ of the frequency outside the band on the upper side included in the output signal.

First, at frequency converter 305, components for the third pilot signal $P_3(t)$ and fourth pilot signal $P_4(t)$ are frequency-converted to a low frequency band. For example, assuming the local oscillation frequency to be $\omega c+\omega p_1+2\pi\times 10$ kHz, the angular frequency of the third pilot signal component and fourth pilot signal component is converted to $2\pi\times 10$ kHz, i.e. the same frequency as the first pilot signal component and second pilot signal component. Because of this, as a result of LPF 306 and A/D converter 307 carrying out the same operation as LPF 117 and A/D converter 118, the pilot signal components of the frequency outside the band on the upper side can be outputted to control section 303.

Figure 14:
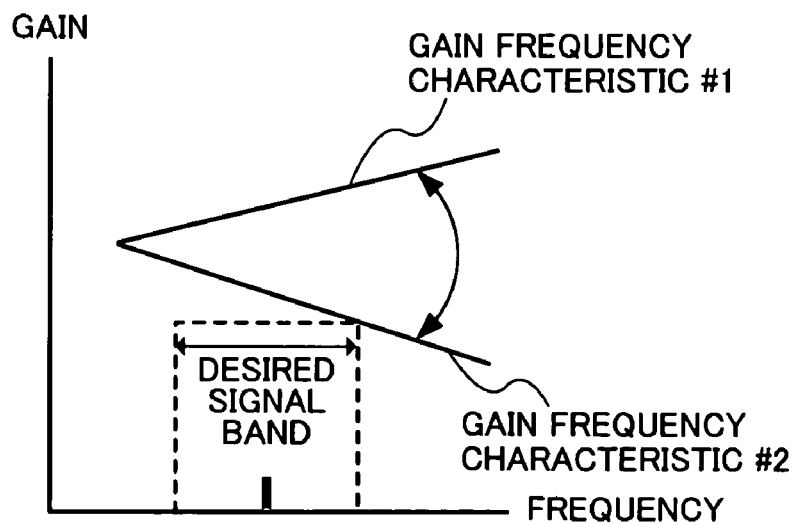
FIG. 14 is a view showing an example of gain characteristics for a frequency characteristic correction section of the third embodiment of the present invention.

When there is no difference in the frequency characteristic from first addition section 103 to first amplifier 111 and from second addition section 104 to second amplifier 112, the pilot signal component of the frequency outside the band on the upper side can also be cancelled out in the same way as for the pilot signal component of the frequency outside the band on the lower side. On the other hand, in the event that there are any differences in the frequency characteristics, the pilot signal component of the frequency outside the band on the upper side is detected without being canceled. Control section 303 controls frequency characteristic correction section 301 in such a manner that the level of the detected pilot signal component of the frequency outside the band on the upper side is made minimum. An example of gain characteristic for frequency characteristic correction section 301 is shown in FIG. 14. Frequency characteristic correction section 301 is capable of changing the frequency characteristics for gain from the gain frequency characteristic #1 to the gain frequency characteristic #2 by, for example, changing coefficients of digital filters in digital signal processing.

Namely, for the differences in the gain and phase between two amplifying systems, adjustment (correction) of the gain and phase at vector adjustment section 105 is controlled by detecting the pilot signal component of the frequency outside the band on the lower side, and for the differences in the frequency characteristic for gain, correction of the frequency characteristic at frequency characteristic correction section 301 is controlled by detecting a pilot signal component of the frequency outside the band on the upper side.

A description is given in FIG. 14 of correction of frequency characteristics for gain but correction of a frequency characteristic for phase is also possible with a similar operation.

Further, a variable delay circuit may also be employed as a means for correcting the frequency characteristics for phase.

According to this embodiment, a difference in frequency characteristic of two systems of LINC system amplifier circuit 300 is calculated by comparing the pilot signals which are simple signals such as sine waves using control section 303. Correction of frequency characteristics is then carried out by frequency characteristic correction section 301 based on the calculated difference in frequency characteristics. It is therefore possible to obtain an output signal with a higher power efficiency and little distortion.

Fourth Embodiment

Figure 15:
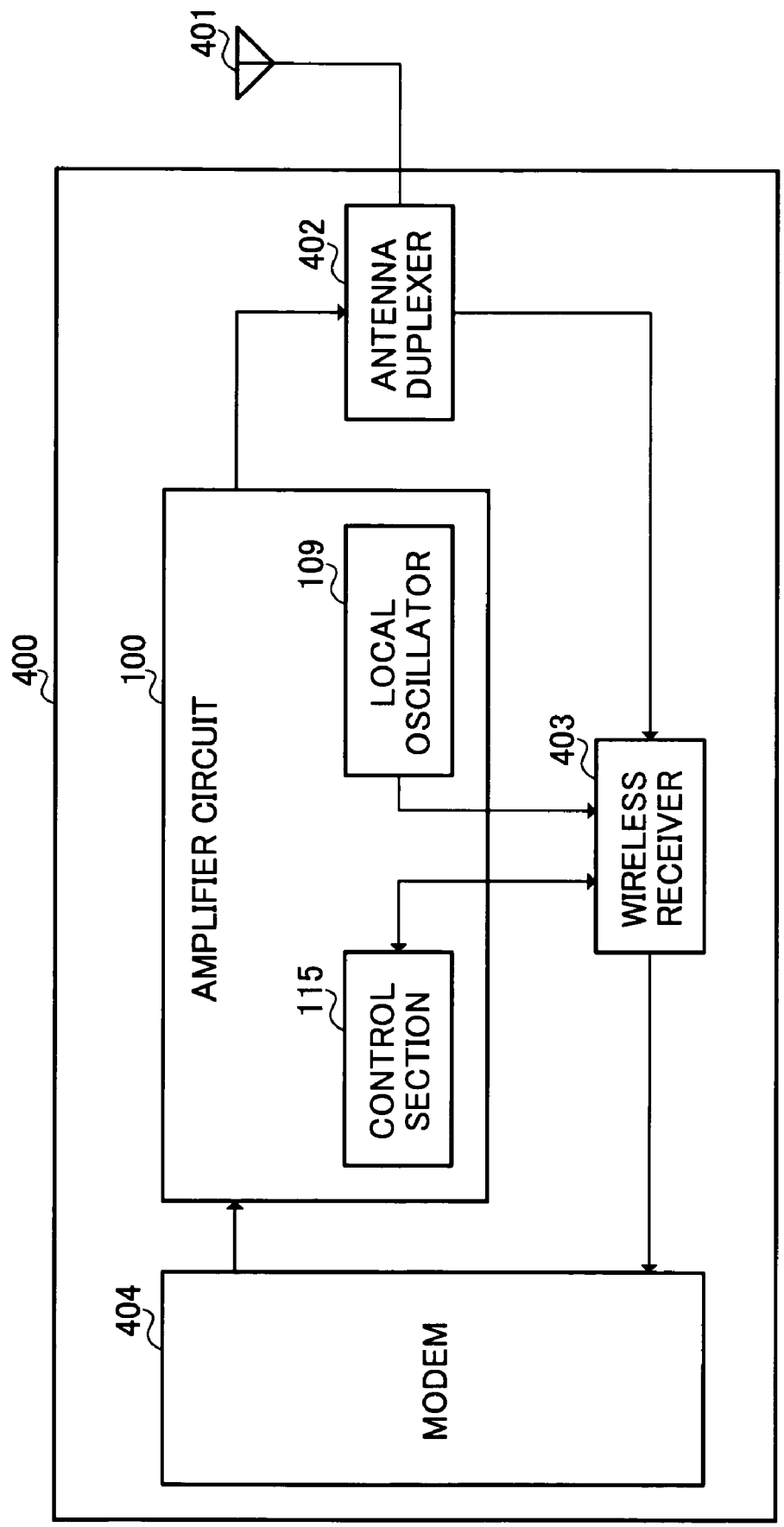
FIG. 15 is a block diagram showing a configuration for a wireless transceiver apparatus of a fourth embodiment of the present invention.

FIG. 15 is a block diagram showing a configuration for a wireless transceiver apparatus of a fourth embodiment of the present invention. Wireless transceiver apparatus 400 shown in FIG. 15 is comprised of amplifier circuit 100 described in the first embodiment, antenna 401 for transmitting and receiving wireless signals, an antenna duplexer 402 for duplexing transmission and reception for antenna 401, outputting output signals of amplifier circuit 100 to antenna 401, and outputting signals received by antenna 401 to wireless receiver 403, wireless receiver 403 constituting a circuit for extracting desired received signals from the output signals of antenna duplexer 402, and configured, for example, from a low noise amplifier, a mixer performing frequency conversion, a filter, a variable gain amplifier, a A/D converter and the like, and modem 404 for modulating signals for audio, images, data and the like to signals to be wirelessly transmitted, and for demodulating signals for audio, images, data and the like from wirelessly received signals.

Wireless transceiver apparatus 400 may also adopt a configuration having one of amplifier circuit 200 and amplifier circuit 300 described in the second embodiment and third embodiment, respectively, in place of amplifier circuit 100.

As a result of wireless transceiver apparatus 400 of this embodiment using an amplifier circuit described in either of the above embodiments to amplify signals for transmission, it is possible to make circuit scale small and make a distortion component included in a transmission signal small at low manufacturing costs.

Further, wireless transceiver apparatus 400 may adopt a configuration where not only is a local oscillation signal outputted by local oscillator 109 provided at amplifier circuit 100 shared by the mixer of wireless receiver 403, but also control section 115 provided at amplifier circuit 100 is used for controls (for example, automatic gain control or the like) at wireless receiver 403. Because of this, it is possible to make the apparatus scale for wireless transceiver apparatus 400 drastically smaller.

According to this embodiment, it is possible to achieve the same operations and effects as the operations and effects described in any of the first to third embodiments at wireless transceiver apparatus 400, it is possible to make the apparatus scale for wireless transceiver apparatus 400 drastically smaller, it is possible to keep a distortion component included in a transmitted signal to a level that does not hinder communication, and it is possible to receive data without errors at a receiver.

The wireless transceiver apparatus 400 described in the above embodiments may be applied to a wireless base station apparatus or communication terminal apparatus used in a wireless communication and broadcast network.

This specification is based on Japanese Patent Application No. 2003-333490, filed on Sep. 25, 2003, the entire content of which is expressly incorporated herein by reference.

INDUSTRIAL APPLICABILITY

The amplifier circuit and amplifying method of the present invention is effective in obtaining an output signal with high power efficiency and little distortion while suppressing increases in circuit scale of the amplifier circuit, and is useful, for example, as an amplifier circuit for amplifying transmission signals in a transmission apparatus used in wireless communication and broadcast, and as an amplifying method thereof.

The invention claimed is:

1. An amplifier circuit comprising:
    a constant envelope signal generating section for generating a plurality of constant envelope signals from an input signal;
    a pilot signal generating section for generating a plurality of pilot signals associated with the generated plurality of constant envelope signals, respectively, the plurality of pilot signals having predetermined amplitudes, predetermined phases and predetermined frequencies, respectively, said phases and frequencies being different from each other;
    an addition section for adding the plurality of pilot signals to the generated plurality of constant envelope signals;
    an amplifying section for amplifying the plurality of constant envelope signals to which the plurality of pilot signals are added; and
    a correction section for correcting an amplitude or phase of one of the generated plurality of constant envelope signals using a signal component included in the amplified plurality of constant envelope signals and corresponding to the plurality of pilot signals, wherein:
    the pilot signal generating section generates the plurality of pilot signals including a first pilot signal and second pilot signal of a frequency lower than a frequency band of the input signal, and a third pilot signal and fourth pilot signal of a frequency higher than the frequency band of the input signal.

2. The amplifier circuit according to claim 1, wherein the pilot signal generating section generates the plurality of pilot signals which are sine wave signals.

3. The amplifier circuit according to claim 1, wherein the pilot signal generating section generates the plurality of pilot signals in such a manner that amplitudes thereof are equal to each other.

4. The amplifier circuit according to claim 1, wherein the pilot signal generating section generates the plurality of pilot signals having frequencies outside the frequency band of the input signal.

5. The amplifier circuit according to claim 1, further comprising a combining section for combining the plurality of constant envelope signals to which the plurality of pilot signals are added,
wherein the pilot signal generating section generates the plurality of pilot signals which cancel each other out when combining is performed by the combining section.

6. The amplifier circuit according to claim 1, wherein the pilot signal generating section generates the plurality of pilot signals including the first pilot signal and the second pilot signal which have opposite phases to each other.

7. The amplifier circuit according to claim 1, further comprising a frequency characteristic correction section for correcting a frequency characteristic of one of the generated plurality of constant envelope signals using a signal component included in the amplified plurality of constant envelope signals and corresponding to the plurality of pilot signals.

8. A wireless base station apparatus comprising the amplifier circuit according to claim 1.

9. A wireless terminal apparatus comprising the amplifier circuit according to claim 1.

10. An amplifying method comprising the steps of:
generating a plurality of constant envelope signals from an input signal;
generating a plurality of pilot signals associated with the generated plurality of constant envelope signals, respectively, the plurality of pilot signals having predetermined amplitudes, predetermined phases and predetermined frequencies, respectively, the phases and frequencies being different from each other;
adding the plurality of pilot signals to the generated plurality of constant envelope signals;
amplifying the plurality of constant envelope signals to which the plurality of pilot signals are added; and
correcting an amplitude or phase of one of the generated plurality of constant envelope signals using signal components included in the amplified plurality of constant envelope signals and corresponding to the plurality of pilot signals, wherein:
the plurality of pilot signals includes a first pilot signal and second pilot signal of a frequency lower than a frequency band of the input signal, and a third pilot signal and fourth pilot signal of a frequency higher than the frequency band of the input signal.

* * * * *